US011265001B1

(12) United States Patent
Lahiri (10) Patent No.: US 11,265,001 B1
(45) Date of Patent: Mar. 1, 2022

(54) RF DAC WITH LOW NOISE SPECTRAL DENSITY AND MISMATCH SPURS

(71) Applicant: XILINX, INC., San Jose, CA (US)

(72) Inventor: Abhirup Lahiri, Dublin (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/115,530

(22) Filed: Dec. 8, 2020

(51) Int. Cl.
  *H03M 1/06* (2006.01)
  *H03M 1/08* (2006.01)
(52) U.S. Cl.
  CPC ....... *H03M 1/0614* (2013.01); *H03M 1/0863* (2013.01)
(58) Field of Classification Search
  CPC .......................... H03M 1/0644; H03M 1/0863
  USPC .......................................... 341/118, 144, 120
  See application file for complete search history.

(56) References Cited

U.S. PATENT DOCUMENTS 9,000,812 B1 * 4/2015 Lowney ............... H03K 17/162
  327/108

OTHER PUBLICATIONS

Lin, C., et al., "A 12 bit 2.9 GS/s DAC With IM3 $ « -$60 dBc Beyond 1 GHz in 65 nm CMOS," IEEE Journal of Solid-State Circuits, vol. 44, No. 12, pp. 3285-3293, Dec. 2009.

* cited by examiner

*Primary Examiner* — Peguy Jean Pierre
(74) *Attorney, Agent, or Firm* — Patterson + Sheridan, LLP (57) ABSTRACT

A DAC current steering circuit includes first and second transistors, respectively coupled to first and second outputs via first and second nodes at their drains, and source coupled to each other and to ground. A gate of the first transistor is coupled to a data input (D), and a gate of the second transistor coupled to a complement of the data input (DB). The circuit further includes first and second bleeder transistors, whose drains are respectively coupled to the first and second nodes, and whose sources are coupled together at a third node, the third node coupled to ground, and first and second bleeder switching transistors, whose drains and sources are each coupled to the third node, a gate of the first bleeder switching transistor coupled to a switching input (S) and a gate of the second bleeder switching transistor coupled to a complement of the switching input (SB).

20 Claims, 8 Drawing Sheets

610 — receiving a digital data signal ("D") at a gate of a first transistor of a source coupled pair of a DAC, and a complement of the data signal ("DB") at a gate of a second transistor of the pair, the sources further coupled to ground, the drains respectively coupled to a first output and a second output 620 — generating bleeder currents at each of first and second side bleeder arms and a central bleeder arm, the first side bleeder arm coupled to the first transistor and to ground, the second side bleeder arm coupled to the second transistor and to ground, and the central bleeder arm coupled to each of the first and second transistors and to a central bleeder current node, the central bleeder current node coupled to ground 630 — applying a first shadow switching input (S) to a gate of a first shadow switching transistor, and a complement of the switching input (SB) to a gate of a second shadow switching transistor, wherein drains of each of the first and second shadow switching transistors are coupled together and to sources of the first and second shadow transistors, and are further coupled to the central bleeder current node 640 — switching S and SB at a pre-defined clock frequency of the DAC whenever the D and DB signals are not toggled.

FIG. 6

RF DAC WITH LOW NOISE SPECTRAL DENSITY AND MISMATCH SPURS

TECHNICAL FIELD

Embodiments of the present invention generally relate to digital to analog converters (DACs), and in particular to a radio frequency (RF) DAC that implements split bleeder source switching.

BACKGROUND

Digital-to-analog conversion is the process of converting digital (binary) codes into a continuous range of analog signal levels. Digital codes can be converted into analog voltage, analog current, or analog charge signals using a digital-to-analog converter (DAC).

It is noted that in synthesizing a signal using a DAC, frequency planning can prove to be difficult due to a second order performance (HD2) spur folding back around an input frequency Fin. For example, a 3.4 GHz signal synthesis using a 10 GHz sampling DAC can fold the HD2 spur at around 3.2 GHz. This is because as a result of conversion, for a given synthesized signal F1, with a given sampling clock frequency Fclk, the following harmonic contents are theoretically generated (including distortion components): F1, 2*F1, 3*F1, etc., Fclk-F1, Fclk-2*F1, Fclk-3*F1, etc. . . . , Fclk+F1, Fclk+2*F1, Fclk*3*F1, etc., and many other harmonics involving other multiples of Fclk. Thus, while the amplitude of the harmonic content may vary, each such harmonic is theoretically there. Thus, an HD2 of 3.2 GHz with F1=3.4 GHz and Fclk=10 GHz, is the result of 10G-2*3.4 At higher frequencies, much of the this HD2 performance arises from common mode switching glitches from the current cell differential pair switching during current steering, and which can be seen in the differential spectrum due to non-zero mismatch, for example, a -30 dB of common mode rejection, of the output network.

Shadow switching inside the DAC current steering cell can improve the HD2 leak components that arise in the output differential spectrum due to output network mismatch (finite common mode rejection ratio (CMRR)). However, providing such a switching mechanism through switching transistors (by shadow signals) can lead to spurious tones at Fs/2 and (Fs/2-Fin) frequencies due to mismatch between switching devices. One conventional technique to reduce such spurious tones is to randomize the selection of the unary cells. However, this increases the noise spectral density (NSD).

Thus, a need exists for circuits that provides shadow switching with low spurious tones.

SUMMARY

Various DAC current steering cells are described herein. A method of operating a DAC current cell is also described herein. In one example, a DAC current steering circuit is provided. The circuit includes first and second transistors, a drain of the first transistor coupled to a first output, a source of the first transistor coupled to a drain of the second transistor at a first node, and a gate of the second transistor coupled to a data input (D). The circuit further includes third and fourth transistors, a drain of the third transistor coupled to a second output, a source of the third transistor coupled to a drain of the fourth transistor at a second node, and a gate of the fourth transistor coupled to a complement of the data input (DB). The circuit still further includes a first bleeder transistor, whose drain is coupled to the first node, and a second bleeder transistor, whose drain is coupled to the second node, the sources of the first and second bleeder transistors being coupled together at a third node, and the third node coupled to ground. Finally, the circuit also includes first and second bleeder switching transistors, whose drains and sources are each coupled to the third node, a gate of the first bleeder switching transistor coupled to a switching input (S) and a gate of the second bleeder switching transistor coupled to a complement of the switching input (SB).

In some examples, there are one or more transistors in a first side bleeder current stack, the first node coupled to ground through the first side bleeder current stack.

In some examples there are one or more transistors in a second side bleeder current stack, the second node coupled to ground through the second side bleeder current stack.

In another example a split bleeder circuit for a DAC circuit is provided. The circuit includes a first bleeder current arm coupled to a first node of the DAC circuit, the first node coupled to a first output of the DAC circuit, and to ground, and a second bleeder current arm coupled to a second node of the DAC circuit, the second node coupled to a second output of the DAC circuit, and to ground. The circuit further includes a central bleeder current arm coupled to each of the first and second nodes and to a common bleeder node, the common bleeder node coupled to ground, and still further includes a pair of shadow switching transistors whose drains and sources are each coupled to the common bleeder node, gates of the first and second shadow switching transistors respectively coupled to a switching input (S) and its complement (SB).

In still another example, a method of operating a DAC current cell with split bleeder currents is provided. The method includes receiving a digital data signal ("D") at a first transistor of a coupled transistor pair of a DAC, and a complement of the data signal ("DB") at a second transistor of the coupled transistor pair. The method further includes generating bleeder currents at each of first and second side bleeder arms and a central bleeder arm, the first side bleeder arm coupled to the first transistor and to ground, the second side bleeder arm coupled to the second transistor and to ground, and the central bleeder arm coupled to each of the first and second transistors and to a central bleeder current node, the central bleeder current node coupled to ground. The method still further includes applying first and second shadow switching inputs to gates of first and second shadow switching transistors, wherein drains of each of the first and second shadow switching transistors are coupled together and to sources of the first and second shadow transistors, and are further coupled to the central bleeder current node.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Various circuits are described below that provide a low noise spectral density (NSD) at the output of an RF DAC which features switching technique with low spurious performance due to device mismatch. The circuit uses a split bleeder arms wherein part of the bleeder arms provides a switching technique to improve distortion performance which includes improvement of residual second order distortion components due to output network mismatch and third order distortion components due to improved ISI performance while the other non-switching arms aims to improve the third order distortion components due to code dependent output impedance loading. The proposed splitting scheme further ensures low NSD performance at DAC output and provides all of the above advantages at zero additional current consumption as it re-uses the available circuitry.

In one or more examples, a DAC current steering circuit may improve spurious performance by >15 dB. In one or more examples, the DAC current steering circuit may provide a low NSD (noise penalty<0.4 dB). In such examples this may be done by providing the DAC current steering circuit with two types of bleeder arms. These include non-switching bleeder arms as well as a switching bleeder arm having shadow switching transistors. The switching arm is devised by shorting the source of the cascade transistors where the switching transistors are connected, thereby ensuring a low spurious performance due to device mismatch between switching devices. In a first order approximation, any mismatch between switching devices is differentially cancelled. Also, due to the split nature of the technique, the NSD increase penalty due to source shorted cascade transistors is minimal.

Figure 1:
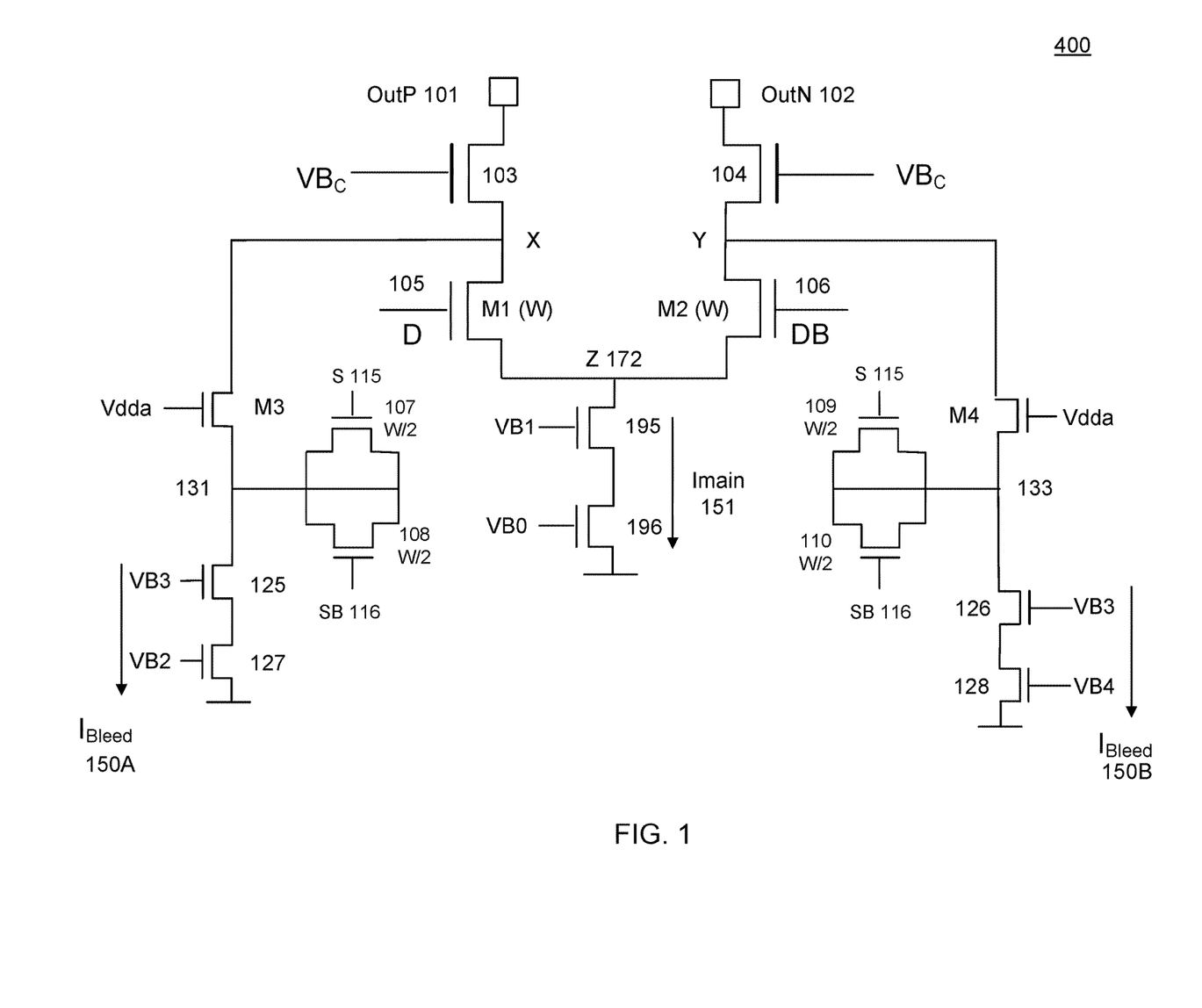
FIG. 1 illustrates a current steering DAC circuit with bleeder current source and bleeder source switching.

Turning now to FIG. 1, a conventional current steering DAC cell with added bleeder current sources is illustrated. As noted above, the addition of bleed currents is a conventional approach that seeks to improve the linearity of the DAC. With reference to FIG. 1, it is noted that it has several common features with each of the examples illustrated in subsequent figures, and it is thus convenient to describe them once, at the outset of this disclosure, with reference to FIG. 1. Then, the description of the subsequent figures provided below may focus on the additions and modifications to the basic DAC cell of FIG. 1, as are respectively illustrated in each of the bleeder current arm examples of FIGS. 2A-2C and the complete DAC cell with split bleeder arms illustrate din FIG. 3. In some examples, the conventional current steering DAC cell of FIG. 1 may be one cell out of, for example, 1024 equally sized cells provided in parallel, for a 1024 bit DAC. The DAC cells are collectively used to convert a set of digital inputs into an output analog signal waveform.

Continuing with reference to FIG. 1, there is shown a differential amplifier 100 that includes two stacks of cascoded transistors. One stack is on the left, including transistors 103 and M1, and connected to a first output, OutP 101, and another stack is shown on the right of the figure, including transistors 104 and M2, and is connected to a second output, OutN 102. M1 and M2 are generally identical transistors, as are upper transistors 103 and 104. As shown, the upper transistors 103 and 104 have an identical voltage VBc supplied to each of their gates, which keeps them both on. In some examples, VBc may be equal to or close to an upper voltage VDD (not shown) that is supplied to the differential amplifier. The lower tier of transistors, namely M1 and M2, have gates that are supplied with data signal D 105 and its complement DB 106, respectively. The lower set of transistors M1 and M2 are source connected at node Z 172. Current steering DAC cell 100 steers the current to one of the two outputs OutN 102 or OutP 101 by the gate voltage that is applied to the lower transistors M1 and M2. Thus, when D is high, or a logical "1", then M1 is on, and M2 is off, and the current is steered through OutP 101. Conversely, when D is low, and thus a logical "0", then its complement DB is a logical "1" and transistor M1 is off, and transistor M2 is on. As a result, in this case the current is steered through OutN 102. In one or more examples, the signals D and DB are supplied to the DAC cell by digital circuitry to which a plurality of DAC current steering cells 100 are coupled. In general, DAC cell 100 has its own driver circuit, which may be, for example a CMOS driver, essentially a CMOS inverter. This allows each DAC cell in a plurality of DAC cells to be independently controlled, so that any shape of waveform, with essentially any set of frequency components, may be output by the DAC.

Another parameter of the DAC cell is the frequency at which D and DB are toggled. Thus, not only is current steered right of left by DAC cell 100 as a function of the logical values of D and DB, but it is done so at a certain desired frequency. For example, if a 3.5 GHz signal is desired to be output by DAC cell 100, then D and DB may toggle 2*3.5 billion times per second. As described in greater detail below, each time these D and DB signals toggle, unless the load on each of OutP 101 and OutN 102 is perfectly matched, a glitch is generated.

Continuing with reference to FIG. 1, at the bottom of the differential amplifier there is a current source element, made of cascoded transistors 195 and 196, whose gates are supplied with VB1 and VB0, respectively, such as, for example, by current mirrors. These voltages VB1 and VB0, a function of the currents being mirrored, determine the overall current Imain 151 through the differential amplifier of DAC cell 100. It is noted that there could be, in alternate examples, a single transistor instead of the two transistors 195 and 196 as shown.

Although not shown in FIG. 1, at each output OutP 101 and OutN 102 there is a resistive load connected between a supply voltage VDD and the respective output. The resistances connected to OutP 101 and to OutN 102 are generally fixed resistors. An analog voltage is thus developed across each respective resistive load by steering the current left or right, in the circuit of FIG. 1. For example, when the current is steered to OutP 101, then the voltage at OutP 101, which is VoutP=$V_{DD}$−Imain*R, where R is the fixed resistance connected at OutP, and the voltage at OutN 102 remains at $V_{DD}$, as there is no current flowing through the fixed resistance to which OutN is coupled. The differential voltage between OutP and OutN, {OutP−OutN} is thus ($V_{DD}$−Imain*R)−Vdd=−Imain*R. So, depending upon how the current is steered, OutP and OutN are either high or low. Thus, when the current is steered to OutN 102, then the voltage at OutN 102, which is VoutN=$V_{DD}$−Imain*R, where R is the fixed resistance connected at OutN, and the voltage at OutP 101 remains at $V_{DD}$, as there is no current flowing through the fixed resistance to which OutP is coupled. The differential voltage between OutP and OutN, {OutP−OutN} is thus $V_{DD}$−($V_{DD}$−Imain*R)=+Imain*R. So the differential voltage of the DAC cell fluctuates between −Imain*R and +Imain*R. Each DAC cell connected on the left contributes a 1 Imain*R drop to the voltage on OutP 101, and similarly, each DAC cell connected on the right contributes a 1 Imain*R drop on OutN 102.

Because the voltage on each of OutP and OutN shifts from Vdd to Vdd−Imain*R every time D switches from "0" to "1", or DB switches from "0" to "1", as the case may be, there is a hard switch due to the switching on and off of transistors M1 and M2. Adding bleed currents 150A and 150B ameliorates this hard switching to some extent, as follows. Because there is still some current running through transistor 103, as it remains on due to the fixed gate voltage VBc supplied to it even when transistor M1 is off, and similarly, when transistor M2 is off, due to DB being low, there is still some current running through transistor 104, as it is on due to the fixed gate voltage VBc supplied to it. Thus, by adding the bleed currents $I_{bleed}$ 150A and $I_{bleed}$ 150B, respectively, the cascode transistors 103 and 104 each appear "quasi-on" from the point of view of the output impedance, even when their controlling transistor, namely M1 or M2, respectively, is actually turned off. This is because the bleeder current pulls some current through 103 or 104 even when M1 or M2, as the case may be, is off. Bleeder currents 150A and 150B may be generated, for example, using current mirrors or other current source elements. In some examples the bleed currents 150A, 150B may be one-half that of Imain 151. In general, bleed currents are static, and provide a constant DC current.

Thus, because the bleeder currents provide a "soft-on" state for upper tier transistors 103 or 104, respectively, when M1 or M2 are off, these upper tier transistors appear (e.g., to the output resistive loads) to not be fully off. Thus, the bleeder current pathways may be leveraged to address the glitch energy generated by the toggling of the D and DB signals at a chosen output frequency. In the example of FIG. 1, each of the bleeder currents is generated by a stack of three transistors. Thus, on the left side of the circuit, by M3, 125 and 127, and on the right side of the circuit, by transistors M4, 126 and 128. Transistors M3 and M4 are driven by a voltage Vdda, and as shown, each of transistors 125 and 126 are driven by a voltage VB3, and each of transistors 127 and 128 are driven by a voltage VB2. It is noted that the function of transistors M3 and M4 is to mimic the stack of M1 and M2, so that the transistor stack of, for example, M3, 125 and 127 is similar to the stack of M1, 115 and 116. A similar symmetry is on the right side of the figure, where the transistor stack M4, 126 and 128 mimics the stack M2, 115 and 116. Additionally, transistors M3 and M4 function as cascodes to isolate the bottom devices 125, 127 on the left form any glitches on node X, and bottom devices 126, 128 on the right form any glitches on node Y. This improves performance.

As shown in FIG. 1, this glitch energy effect may be minimized using a set of additional shadow transistor pairs 107, 108 and 109, 110 that are respectively coupled to each of the two bleeder current paths. This is known as "Bleeder Source Switching (BSS)." In each of the additional shadow transistor pairs, one transistor's gate is driven by a switching signal S and the other transistor's gate is driven by its complement, SB. In one or more examples, the shadow transistors are switched so that the combination of the S and SB switching, with the D and DB switching, is at a clock rate of the DAC or at a multiple of the clock rate of the DAC. Thus, when D and DB are in fact toggling, the shadow switching signals S and SB are not toggled (switched).

As shown in FIG. 1, the two shadow transistor pairs are respectively coupled between nodes X and Y and the bleed current sources used to generate $I_{Bleed}$ 150A on the left of the figure, and $I_{Bleed}$ 150B on the right of the figure, respectively. In some embodiments, the transistors in the source coupled differential pair, namely M1 and M2 may have a width W, and each of the shadow switching transistors 107, 108, 109 and 110, may have a width that half of that, or W/2, as shown. In one or more examples, just as transistors M1 and M2 are identical, so are shadow switching transistors 107, 108, 109 and 110. In one or more examples, satisfying these two conditions is beneficial, because the switching energy from the bleeder current paths, and from the main data path shown in the center of the figure, are proportional to their bias currents. As a result, HD2 performance is best when the switching energy from the bleeder paths is the same.

Continuing with reference to FIG. 1, in one or more examples, S 115 and SB 116 have the same amplitude Vdda for a logical "1" as is used to drive D 105 and DB 106 with a logical "1". In such examples, this is done so that the glitch energy added by each switch of S and SB is equal to the glitch energy added by the toggling of D and DB when they are switched. As noted, in shadow switching, S 115 and SB 116 are not switched when D 105 and DB 106 are toggled. When S and SB are switched, their values are thus flipped. For example, a run of the values of S would be {1, 0, 1, 0, 1, 0}, and the corresponding values of SB the inverse, or {0, 1, 0, 1, 0, 1}.

As noted above, in some examples the shadow switching transistors 107, 108 and 109, 110 may have a width half that of main transistors M1 and M2, or W/2. This is so that the total load capacitance seen by a shadow driver (e.g., driving the S and SB signals) is the same as the total load capacitance seen by the main data path driver, driving the D and DB signals. in such examples, they may have a width W/2. It is noted that there is a defined relationship between the toggling of the D 105 and DB 106 signals in the differential amplifier, and the switching of the S and SB signals in each of the bleeder current paths used to respectively generate bleeder currents $I_{Bleed}$ 150A and $I_{Bleed}$ 150B. This is next described with reference to FIG. 2.

Figure 2:
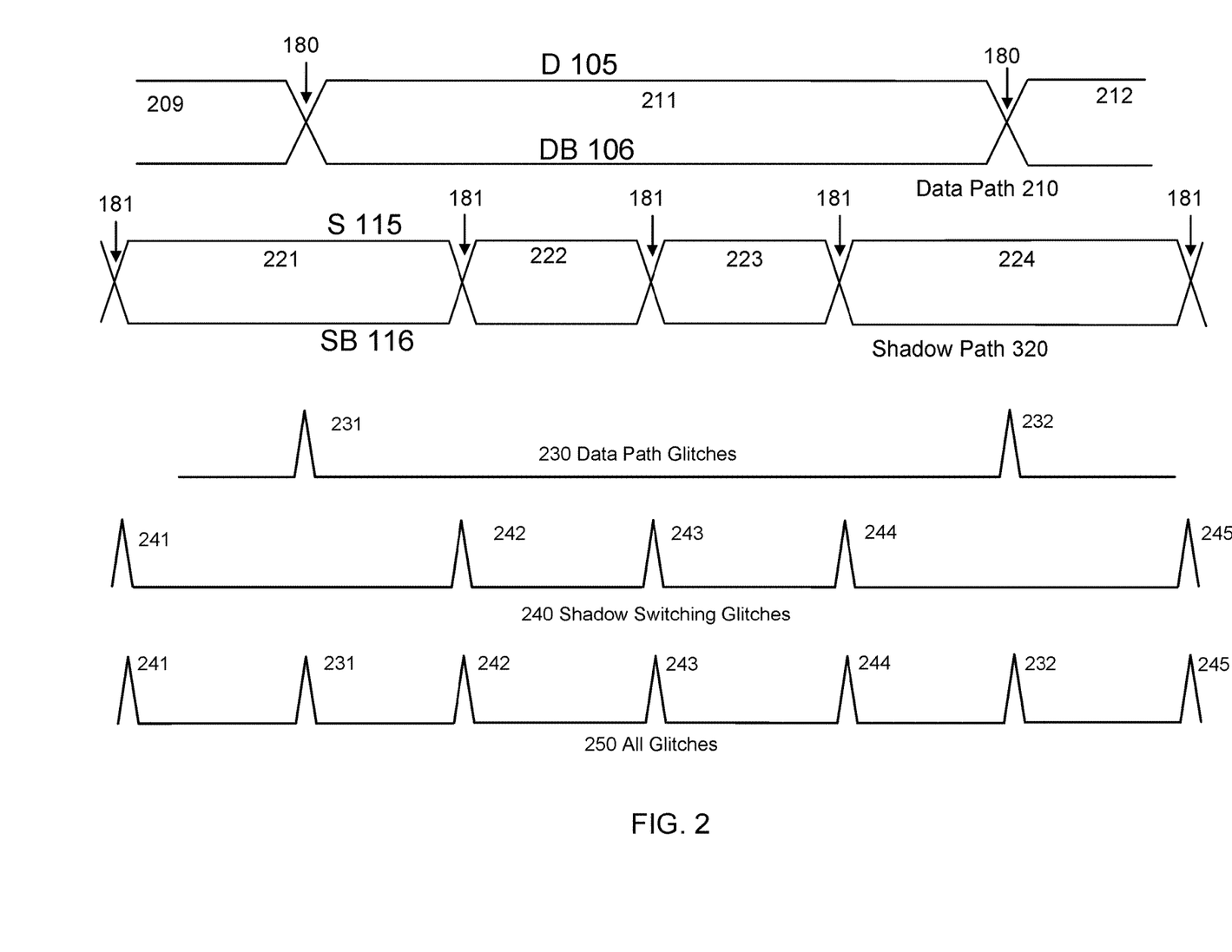
FIG. 2 illustrates the effects of glitch energy added by bleeder path shadow switching, according to an example.

FIG. 2 illustrates the effects of glitch energy added by the shadow switching, according to an example. With reference thereto, data path 210 illustrates two partial intervals, and one full interval, between them, of the D and DB signals. As shown, there are two switching points 180, one at the beginning, and the other at the end, of the signal interval. In this example, D 105 is high during the interval, and thus DB 106 is low. The switching points 180 of the data path occur at a regular temporal interval, which is the frequency of the signal being synthesized by the DAC. For example, this synthesized signal frequency, Fout, may be 3.5 GHz, for example. In one or more examples, the shadow switching frequency Fssw of the S and SB signals, in each of the bleeder current paths, may be an integer multiple of the frequency Fout, or Fssw=K*Fout, where K is an integer greater than 2. Or, more generally, for example, the shadow switching frequency may be a linear combination of Fout and the sampling frequency, or clock frequency Fs, used to generate the output signal. What is important is that Fssw operate so as to convert the glitch energy of switching just D and DB, which is thus data dependent, to a regular, and thus data independent, frequency.

However, in one or more examples, there is a further condition on the switching of the S and SB signals. They are not switched whenever the data path signals are switched. Thus, for example, in FIG. 2, shadow path 220 illustrates switching of the shadow transistor signals S 115 and SB 116. Although the shadow path 220 is switched at a frequency Fs that is four times Fout, and thus there would normally be four toggles of shadow path 220 for every one toggle of data path 210, there are only three switches of the shadow path during a given data path bit time interval, as shown. Thus, continuing with reference to FIG. 2, data path 210 switches at the two switching points 180, and shadow path 220 switches at switching points 181. In the general case, for a given shadow switching frequency multiplier K, for each data path bit interval where D and DB toggle, there will be K−1 switching points 181 on the shadow path 220 during the signal interval of the data path, but there will not be a time when a data path switching point 180 coincides with a shadow path switching point 181. This additional "no switching" condition on the shadow path 220 allows glitching energy of the data path 210, e.g., the toggling of signals D and DB, to add to the glitching energy from the shadow path, e.g., the switching of signals S and SB, so that they fit together to make a regular glitching signal at the frequency Fs. Of course if D and DB do not toggle from bit frame to bit frame, then in such data path intervals S 115 and SB 116 do switch. So, for a run of D={1, 1, 1, 1, 1}, where D 105 and DB 106 do not toggle, S and SB thus do switch at Fs.

Continuing still further with reference to FIG. 2, data path glitches line 230 indicates that there is a glitch corresponding to each switching point 180 in data path 210. Thus, there are two glitches shown, namely a glitch 231 at the beginning of the depicted data signal interval 211 and a glitch 232 at the end of the data signal interval 211. Similarly, shadow switching glitches line 240 illustrates a glitch generated by the shadow switching every time that there is a switching point 181 in the shadow path 220. Thus, there is a glitch 241 occurring during the prior data interval 209, there is no glitch generated when the data path switches at 180 from data interval 209 to data interval 210, there are glitches 242, 243, and 244 generated corresponding to the three switching points 181 that occur during (within) the Illustrated data interval 210, again no glitch generated at the final switching point 180 of data path 210, and finally, a final glitch 245 shown at the next transition in shadow path 220, occurring during the next data signal interval 212. Thus, switching signal intervals 221, 224 on the shadow path 220 that straddle transitions 180 in the data path 210 are twice the length of switching signal intervals 222 and 223 of the shadow path 220 that occur during a data pass signal interval, because they are skipping a shadow signal transition at such times.

Continuing still further with reference to FIG. 2, all glitches line 250 illustrates the sum of both the data path glitches 230 and the shadow switching glitches 240. Thus, on the all glitches 250 line there is a glitch at a regular time interval according to the frequency Fs, which is the same frequency as that used for the shadow switching glitches, but where, as noted, a shadow switch is not performed when a data path switching point 181 occurs.

It is noted that in the example circuit of FIG. 1, which does solve the problem of the common mode glitch energy leakage, there may still be limitations due to mismatch between the cascode devices 107 and 108, on the one hand, and 109 and 110 on the other. With reference again to FIG. 1, starting at the left side of the circuit, the shadow switching pair of transistors 107 and 108 are connected at both their drains and their sources. Their connected sources are also coupled to node 131, which is between the source of transistor M3 and the drain of bleeder current stack 125 and 127. Continuing still with reference to FIG. 1, the coupled sources and drains of transistors 107 and 108, here coupled to node 131, do not change the value of bleeder currents 150A and 150B, as these currents are static, and only follow one path, regardless of the switching of signals S and SB. However, the switching of the S and SB signals applied to the gates of each of transistors 107 and 108, and of 109 and 110, respectively, does generate a glitch each time the signals S and SB are switched. This glitch energy is due to capacitive current feed through the intrinsic capacitance of transistors 107/108 and 109/110. Thus, when the gates of these transistors are toggled with the S and B signals, respectively, a capacitive current is pushed in. As described above, the signals S and SB are switched at a clock rate of Fs, the sampling frequency of the DAC, except that S and SB are not switched when the data signals D and DB themselves are switched, as described above with reference to FIG. 2.

If such a mismatch is present, then, for example, even when D and DB are static (not toggling at all), a glitch spur will be present at a frequency of Fs/2. This is for the following reasons. When shadow switching signal S 115 goes high, then transistors 107 and 109 turn on, and generate glitch energy. Similarly, when at the same time shadow switching signal SB goes low, transistors 108 and 110 turn off, and also generate glitch energy. If there is no mismatch between the transistors 107 and 109, on the one hand, and transistors 108 and 110, on the other hand, then the exact same effect occurs on each side bleeder path, and there is no perceptible effect. However, if there is a mismatch, then, for example, to illustrate the "turn-on" case, the glitch energy i107 on current path 150A is different than the glitch energy i109 on current path 150B, and the difference between them, say i107−i109 is seen. Now, the same thing happens when SB goes high, except now to transistors 108 and 110 generate the glitch energy. If they are mismatched, then the difference between them, say i108−i110 is seen. Thus, for example, for the transistor "turn-on" case on even clock transitions one sees a glitch of i107−i109, and on odd clock transitions one sees a glitch of i107−i109. The same thing happens for glitch energy mismatch for pairs of transistors turning off, as when S goes low and SB goes low, respectively. So, for even clock transitions, where transistors 107 and 109 go on, and transistors 108 and 110 go off, there is one value of total glitch energy, and for odd clock transitions, where transistors 108 and 110 go on, and transistors 107 and 109 go off, there is another value of total glitch energy. So while even clock transitions are equal and odd clock transitions are equal, even and odd clock transitions are different. Because the clock frequency is Fs, this difference has a periodicity that appears as a signal at Fs/2, that flips between glitch energy of signals S going on and SB going off, and a glitch energy of signals SB going on and S going off. Thus, when D and DB are static, and not toggling, this modulation appears at Fs/2. However, if now D and DB are toggling, which is the normal state of affairs, there will be a mixing between this Fs/2 modulation and the toggling frequency of D and DB, Fout. Thus, in that case the mismatches lead to frequency spurs on either side of Fs/2, namely at Fs/2−Fout, and Fs/2+Fout. These spurs, it is noted, would not be present if the bleeder current paths were not switched as shown in the example of FIG. 1, which causes the modulations at Fs/2 to begin with. To illustrate, suppose for example the Fout (frequency of the synthesized analog signal) is 3.0 GHz, and Fs, the clock signal driving the switching of S and SB is 12 GHz. Fs/2=6 GHz, and Fs/2−Fout=6 GHz−3.0 GHz=3.0 GHz, which is exactly Fout, and thus cannot be bandpass filtered out. Or, for example, suppose for example the Fout (frequency of the synthesized analog signal) is 2.4 GHz, and Fs, the clock signal driving the switching of S and SB is 10 GHz. Fs/2=5 GHz, and Fs/2−Fout=5 GHz−2.4 GHz=2.6 GHz, which is very close to Fout. For RF transmission, appropriate frequency planning is needed to avoid these spurs.

It is noted that because the other spur, at Fs/2+Fout=9.0 GHz in the first example, or 7.4 GHz in the second example, is far away from the channel at 3.0 GHz, it does not pose a problem, and may be easily filtered out. To address the spurs close to Fout, however, in one or more examples a DAC circuit with bleeder current shadow switching that provides superior spur performance is illustrated in FIGS. 3C and 4, next described. However, before describing these figures, an evolution of the bleeder source switching circuit of FIGS. 3C and 4 from other possible examples is described with reference to FIGS. 3A and 3B.

Continuing still further for a moment with reference to FIG. 1 and subsequent figures, it is noted that the glitches generated whenever shadow signals S and SB are switched are due to changes in capacitive coupling. In one or more examples, S and SB are switched in a "make before break" manner. In one or more examples, switching the S and SB signals in a make or break approach matches the D and DB switching behavior. Further, because the example circuit of FIGS. 3C and 4 reduces noise and the signal dependent switching signature of a DAC supply, it also reduces the crosstalk between various DACs on the same supply. This is because the signal dependent switching signature from one DAC, working at one frequency, can feed through supply lines due to finite common mode rejection of the second DAC, and thereby corrupt the output spectrum of the second DAC.

Figure 3A:
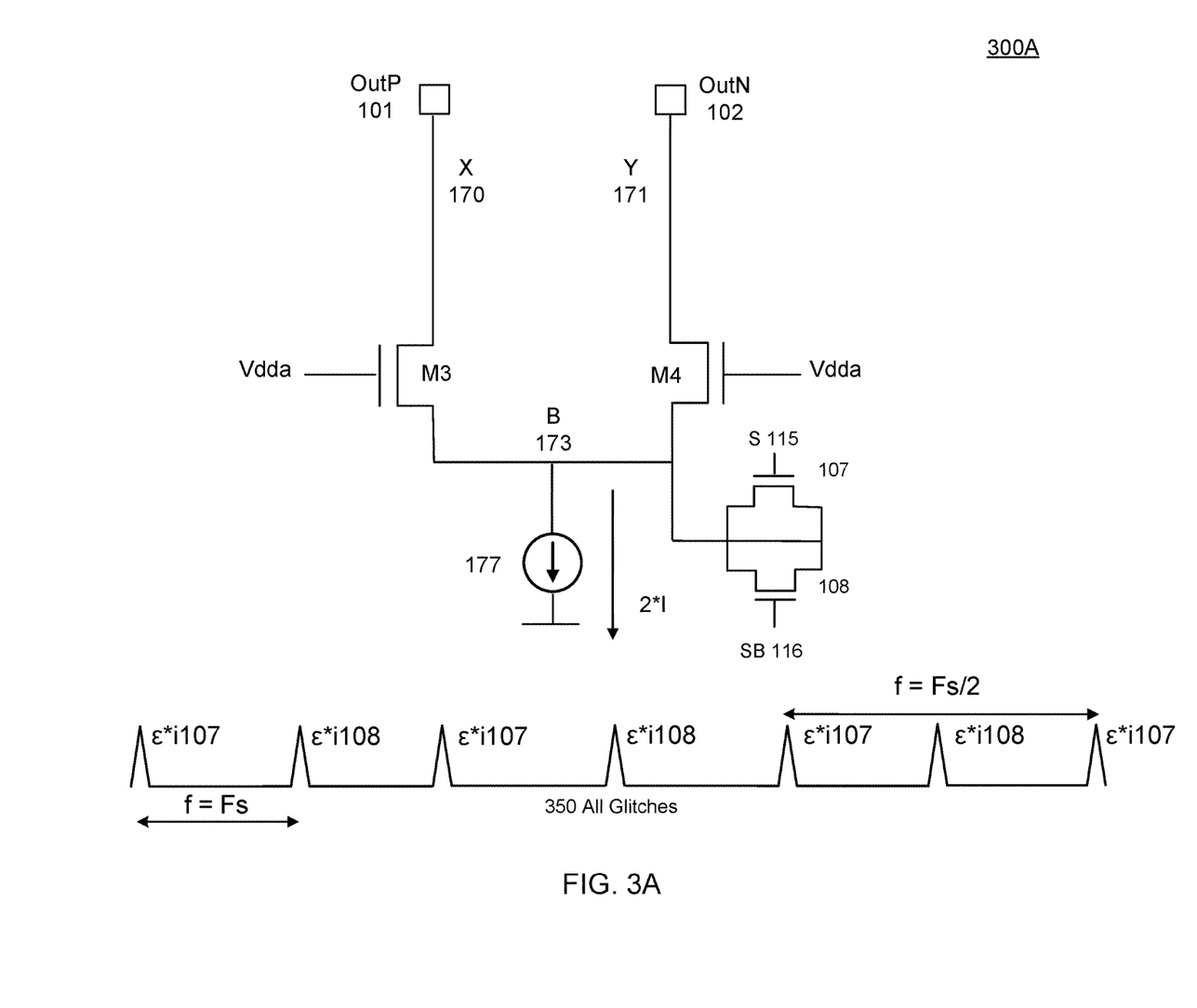
FIG. 3A illustrates an exemplary tail short bleeder arm for a DAC circuit, according to an example.
Figure 4:
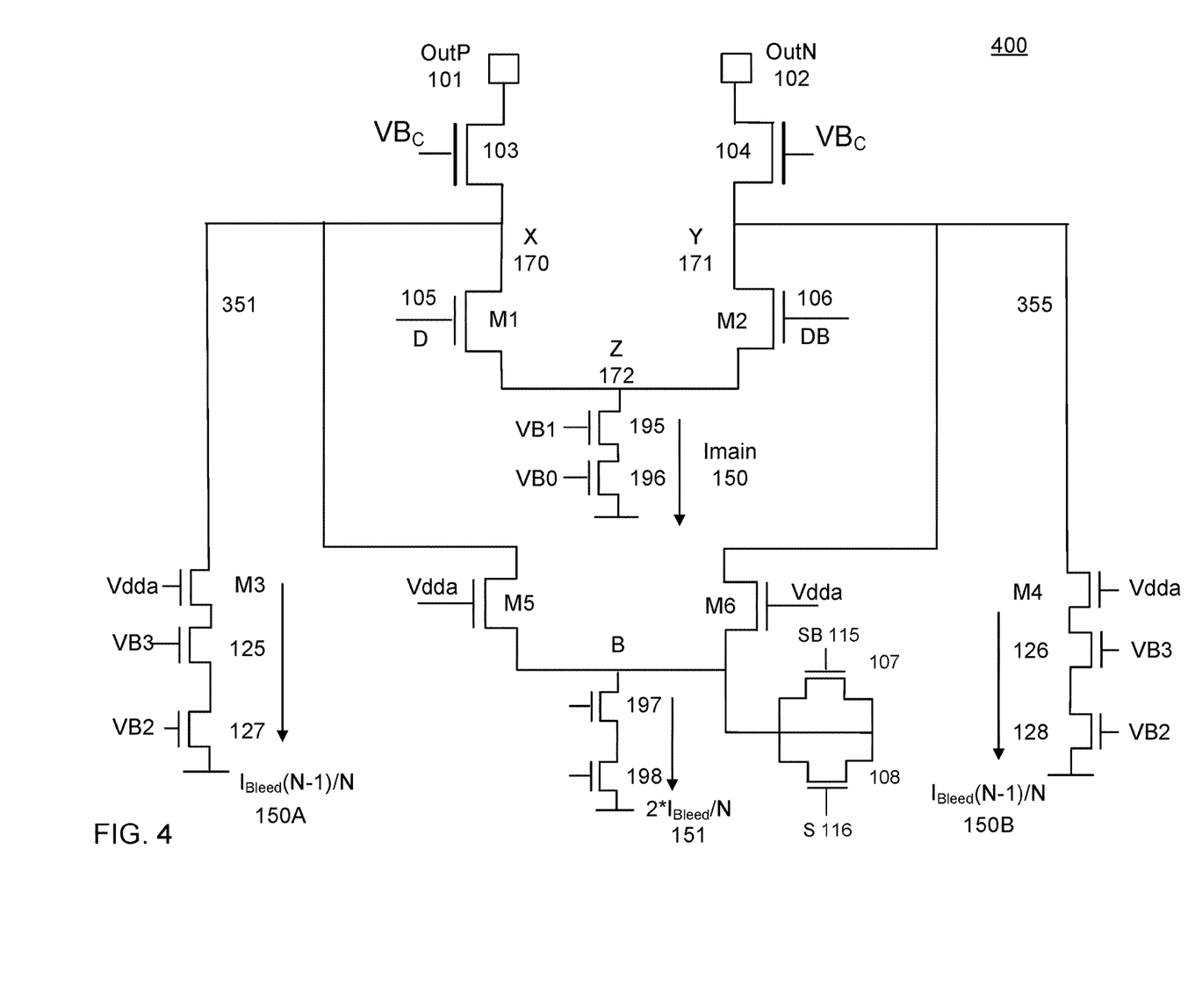
FIG. 4 illustrates a current steering DAC circuit with split bleeder arm, according to an example.

FIG. 3A illustrates an exemplary tail short bleeder arm 300A for a DAC circuit, according to an example. In this example circuit, the two nodes labeled 131 and 133 of the two bleeder arms in FIG. 1 are now connected, as shown in FIG. 3A, at a common node B 173. A single shadow switching transistor pair 107 and 108 is coupled to node B 173. FIG. 3A thus illustrates how the mismatch spur due to the shadow switching transistors that arises in the circuit of FIG. 1 may be reduced by shorting the sources of the bleeder cascade transistors M3 and M4 to create a topology which resembles a differential pair. Although this technique reduces the mismatch spur significantly, it may also increase NSD, especially at lower output signal power settings when the current in the bleeder arms increases. This increase of NSD is due to a higher transconductance (Gm) of the cascade transistors M3 and M4 as compared to Gm of the current source 177. As a result, the noise of the current source is differentially rejected while noise of the cascade devices M3 and M4 appears.

Figure 3B:
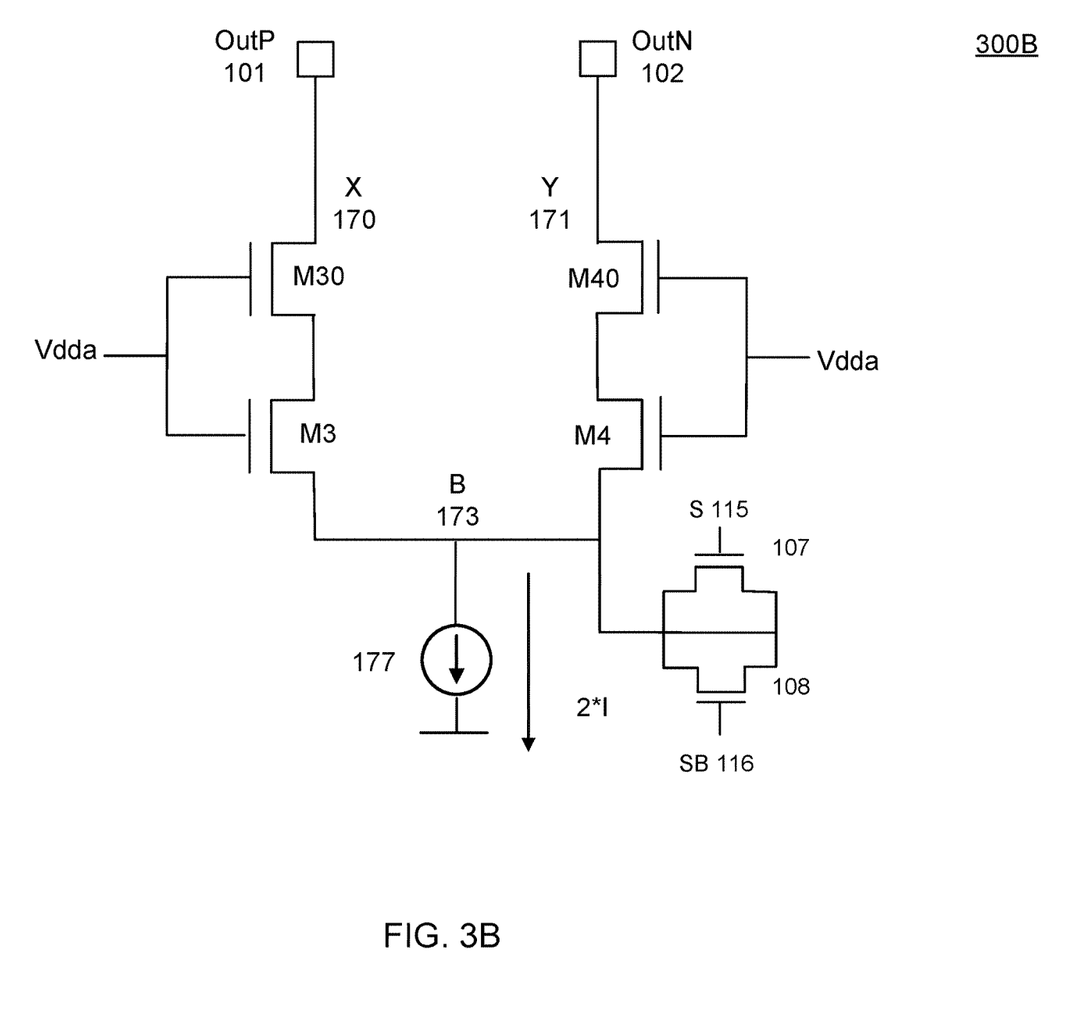
FIG. 3B illustrates an exemplary cascode stack bleeder arm for a DAC circuit, according to an example.
Figure 3C:
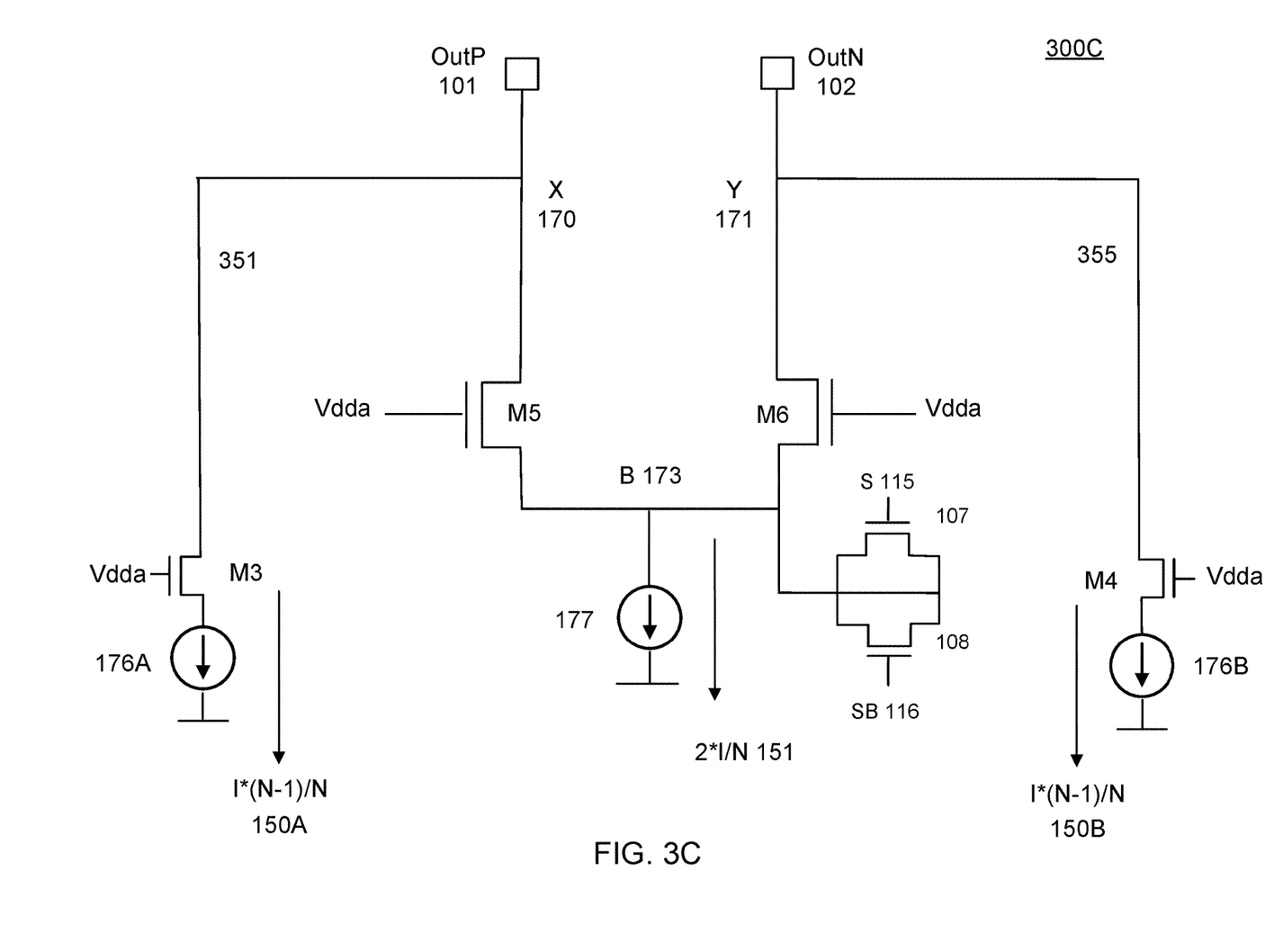
FIG. 3C illustrates an exemplary split bleeder arm for a DAC circuit, according to an example.

Thus, even if transistors M3 and M4 are mismatched, glitch energy from transistors M3 and M4 is common mode attenuated. The only remaining noise is the differential current, and this is shown at the bottom of FIG. 3A, in all glitches 350. With reference thereto, if the mismatch between transistors 107 and 108 is represented as epsilon, c, then as S and SB toggle, the spur energy is the product of two mismatches: E and i107 or i108, as shown. This spur energy has a periodicity of Fs/2, as shown, as every other glitch is the same. Epsilon comes from the mismatch of transistors M3 and M4. The glitch energy difference that arises from the mismatch between shadow switching transistors 107 and 108 is attenuated by the factor c, which could be, for example, 1/20 to 1/50, and thus resulting in a 26 dB to 36 dB attenuation. FIG. 3B illustrates the tail short example of FIG. 3A with two transistors in each arm of the combined bleeder arm. It is noted that transistors M3 and M4 are much smaller in size than transistors used in current sources, such as current source 177. By doubling the transistors on each arm, for example by adding transistors M30 and M40, this creates a lower Gm by effectively doubling the length of the cascade transistors. However, this also increases the capacitance on each arm, and as a result, most of the glitch energy passes from the switching node to ground, and not into the devices. The glitch current enters M3 and M4 based on impedance division between the capacitance at node B 173 and the resistance of transistors M3 and M4 (defined by their Gm). A lower Gm means a higher M3 and M4 resistance, and current flows into the lower impedance path, e.g., the capacitor rather than M3 and M4. Because the bandwidth at the switching node is Gm/C lowering Gm and increasing C actually results in a two-fold reduction in bandwidth. So, while the cascode stack of FIG. 3B provides an improved NSD performance, it also offers worse performance in terms of improving second order distortion. Thus, a still better alternative is needed, and this is provided in FIG. 3C.

FIG. 3C illustrates an example split bleeder arm circuit 300C. Split bleeder arm circuit 300C uses a split bleeder arm technique which reduces the NSD, improves mismatch spur performance, and connects a pair of shadow switching transistors to a shorted source of a differential pair. The example bleeder arm circuit of FIG. 3C provides better common mode leak improvement than the circuit of FIG. 1 due to improved bandwidth at the switching node B 173.

With reference to FIG. 3C, there are three bleeder current arms. A central bleeder current arm where transistors M5 and M6 are source coupled at node B 173, and two side bleeder current arms 351 and 355. Each of the bleeder current transistors M3, M4, M5 and M6 are biased with the same voltage Vdda applied to their respective gates. There are no shadow switching transistors in either of side bleeder current arms 351 and 355. However, in the central bleeder current arm the pair of switching transistors 107 and 108 have both their sources and drains shorted, and all are connected to switching node B 173. Each of the two side bleeder current arms is coupled to one of the outputs, via node X 170 or node Y 171. The central bleeder current arm is coupled to both nodes X 170 and Y 171, as shown, due to its differential pair type structure.

In addition, given that there are now three bleeder current pathways, the circuit may be configured to apportion how much current flows in each arm. This is illustrated in FIG. 3C by the fact that bleeder currents 150A and 150B are each I*(N−1)/N, where I is a given bleeder current $I_{bleed}$ of one side bleeder arm of an analogous circuit such as is shown in FIG. 1, where there is no central bleeder current arm. Thus, between the three bleeder arms, a total current of $2*I_{bleed}$ will flow. In one or more examples, the split of $2*I_{bleed}$ between the central arm and the two side arms is controlled by the value N, in some examples an integer, which may vary so as to optimize the noise in the circuit. In some examples, N may be 3 or 4, for example. For N=4, for example, each side arm has a current of 0.75 $I_{bleed}$, and the central arm has a current of 0.5 $I_{bleed}$. Or, for example, for N=3, each side arm has a current of 0.67 $I_{bleed}$, and the central arm also has a current of 0.67 $I_{bleed}$. As may be appreciated, for very large N, say N=10, most of the bleeder current is sent through the side bleeder arms, and the effect of the shadow switching is minimized. Similarly, for small N, say N=1, all of the bleeder current ($2*I_{bleed}$) is sent through the central arm, and none through any side arm. It is noted that the choice of value for N involves a tradeoff between NSD (noise), spurious and distortion performance. A higher value of N provides lower benefits for distortion performance improvement due to shadow switching, as for higher N the central arm bleeder current 151 is lower, thus reducing the glitch energy provided by the shadow switching, and thus the associated benefits reduce. In one or more examples N may be tunable depending on the application, and can thus be changed to optimize each application in which the DAC circuit is used.

In one or more examples, split bleeder source switching was found to provide superior IM3 and CM leak performance. In some simulations, CM leak performance was improved by 20 dB at a lower VOP setting in normal mode and by 13 dB in mixing mode. It is noted that mixing mode is a DAC operation mode where the data (D and DB signals) are flipped, or swapped, every half cycle. It is a known technique to increase amplitude (e.g., push more energy) in higher signal frequency range (Fs/2 to Fs) compared to normal mode.

FIG. 4 illustrates a complete DAC circuit implementation of a unary current steering cell using split bleeder switching according to one or more examples. Thus, as shown in FIG. 4, the bleeder current circuit of FIG. 3C is coupled to the differentia amplifier of the DAC, which includes M1 and M2 that switch when D and DB toggle.

While the example DAC cells illustrated in each of FIGS. 3A, 3B and 3C and 4 implement the DAC cell in NMOS transistors, other transistor types may be used to implement the circuit, as is known in the art. Thus, for example, if PMOS transistors are used, then the entire circuit would be inverted, with the nodes coupled to ground now coupled to a supply voltage, and the gates of the various transistors driven by voltages less than or equal to 0, as the case may be. Essentially a topology of a PMOS implementation of the circuits shown in FIG. 4 would be a 180 degree rotated version of those circuits about an axis normal to, and protruding out of the page.

Figure 5:
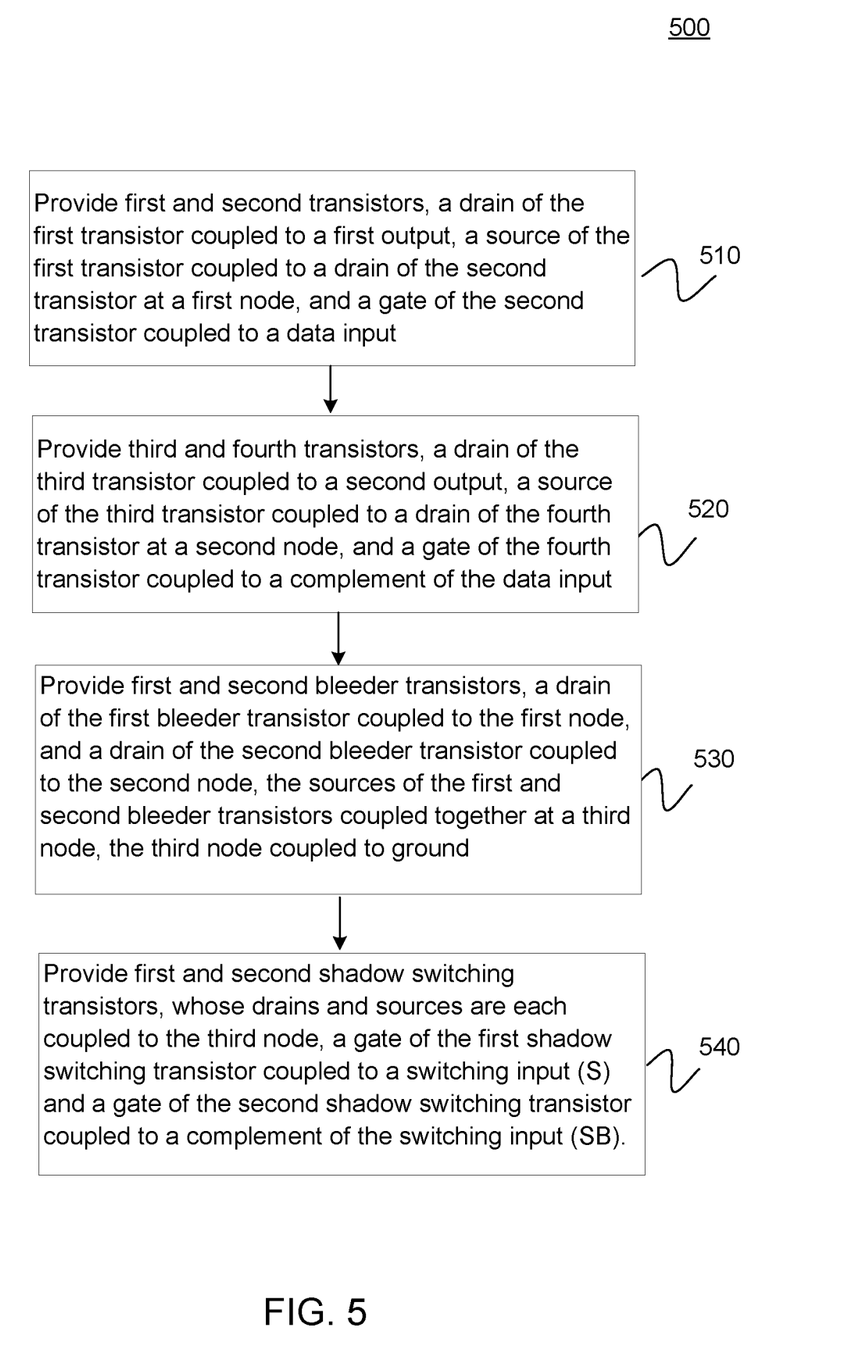
FIG. 5 is a flow diagram of a method for providing a DAC current cell with split bleeder switching, according to an example.

FIG. 5 is a flow diagram of a method for providing a DAC current cell with split bleeder arms and shadow switching, according to an example. Method 500 includes blocks 510 through 540. In alternate examples method 500 may include greater, or fewer, blocks. Method 500 begins at block 510 where a first transistor and a second transistor are provided, a drain of the first transistor coupled to a first output, a source of the first transistor coupled to a drain of the second transistor at a first node, and a gate of the second transistor coupled to a data input. For example, these may be the left side of the differential amplifier illustrated in FIG. 4, and the first node may be node X.

From block 510, method 500 proceeds to block 520, where a third transistor and a fourth transistor are provided, a drain of the third transistor coupled to a second output, a source of the third transistor coupled to a drain of the fourth transistor at a second node, and a gate of the fourth transistor coupled to a complement of the data input. For example, these may be the right side of the differential amplifier illustrated in FIG. 4, and the second node may be node Y.

From block 520, method 500 proceeds to block 530, where first and second bleeder transistors are provided, a drain of the first bleeder transistor coupled to the first node, and a drain of the second bleeder transistor coupled to the second node, the sources of the first and second bleeder transistors coupled together at a third node, the third node coupled to ground. For example the first and second bleeder transistors may be transistors M5 and M6 as shown in FIG. 4, coupled to node B 173. In some examples the sources of the first and second bleeder transistors may be coupled to ground via a bleeder current source, such as the stack comprising transistors 197 and 198 as shown in FIG. 4.

From block 530, method 500 proceeds to block 540, where first and second shadow switching transistors are provided, whose drains and sources are each coupled to the third node, a gate of the first shadow switching transistor coupled to a switching input (S) and a gate of the second shadow switching transistor coupled to a complement of the switching input (SB). For example the first and second shadow switching transistors may be shadow switching transistors 107 and 108, as shown in FIG. 4, also coupled to node B 173.

Method 500 terminates at block 540.

Figure 6:
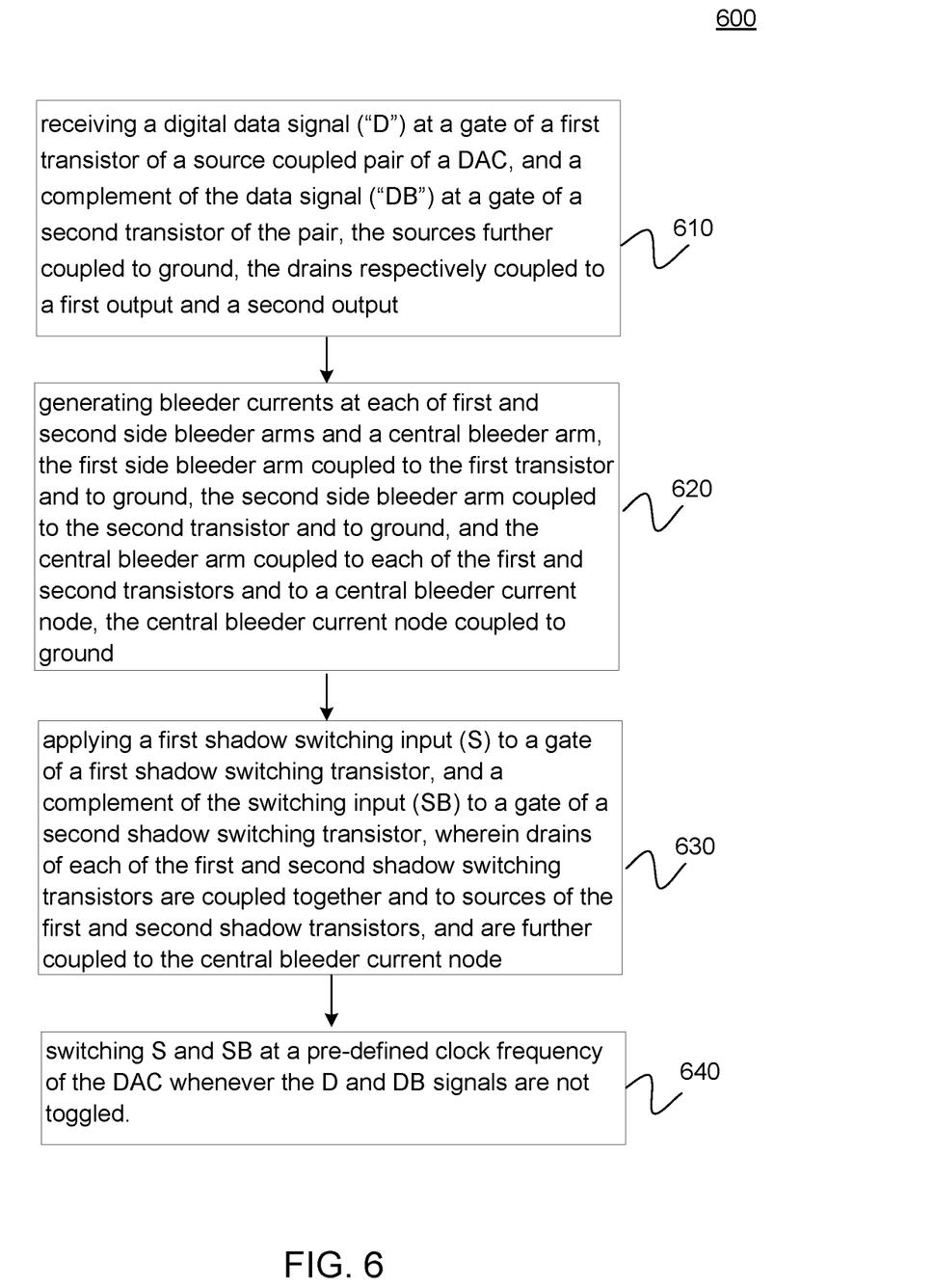
FIG. 6 is a flow diagram of a method of operating a DAC current cell with split bleeder switching, according to an example.

FIG. 6 is a flow diagram of a method of operating a DAC current cell with split bleeder arms and shadow switching, according to an example. Method 600 includes blocks 610 through 640. In alternate examples method 600 may include greater, or fewer, blocks. Method 600 begins at block 610 where a digital data signal ("D") is received at a gate of a first transistor of a source coupled pair of a DAC, and a complement of the data signal ("DB") at a gate of a second transistor of the pair, the sources further coupled to ground, and the drains respectively coupled to a first output and a second output. For example, the DAC current cell may be cell 400 of FIG. 4, the first and second transistors M1 and M2, the data signal D 105, and its complement DB 106.

From block 610, method 600 proceeds to block 620, where bleeder currents are generated at each of first and second side bleeder arms and a central bleeder arm, the first side bleeder arm coupled to the first transistor and to ground, the second side bleeder arm coupled to the second transistor and to ground, and the central bleeder arm coupled to each of the first and second transistors and to a central bleeder current node, the central bleeder current node coupled to ground. For example, with reference to FIG. 4, the first and second side bleeder arms may be arms 351 and 355, and each may be biased by a current source so as to generate currents 150A and 150B, respectively, each having a value of $I_{bleed}(N-1)/N$. The central bleeder arm may include source connected transistor pair M5 and M6, and they may be coupled to node B 173, which may also be coupled to a central bleeder current source stack generating bleeder current 151, which may be $2*I_{bleed}/N$.

From block 620, method 600 proceeds to block 630, where S is applied to a gate of a first shadow switching transistor, and SB is applied to a gate of a second shadow switching transistor, wherein drains of each of the first and second shadow switching transistors are coupled together and to sources of the first and second shadow switching transistors, and are further coupled to the central bleeder current node. For example, with reference to FIG. 4, the first and second shadow switching transistors may be transistor pair 107 and 108, and they may also be coupled to node B 173, which, as noted, is coupled to ground via a central bleeder current source stack generating bleeder current 151, which may be $2*I_{bleed}/N$.

From block 630, method 600 proceeds to block 640, where S and SB are switched at a pre-defined clock frequency of the DAC whenever the D and DB signals are not toggled. For example, the DAC circuit 400 may have logic that takes as inputs D and DB, and switches S and SB at every period of a chosen shadow switching frequency Fssw, whenever D and DB are not toggling. In one or more examples, Fssw is simply the sampling frequency used by the DAC in generating the analog output signal, Fs. Because Fssw is much higher than that of the output signal Fout, S and SB are switched at most intervals. They are only not switched when a switching interval for Fout and Fssw coincide, and also when, at that particular coincident switching interval, D and DB are toggled (as opposed to D staying at its prior interval's value).

Method 600 terminates at block 640.

Thus, according to one or more examples, a data dependent glitch, which may be very hard to filter out, occurring very close to the Fout itself, is converted to a glitch that occurs at the sampling frequency of the DAC, for example. This is done by introducing additional glitch energy at the sampling frequency of the DAC, and thus converting the data glitch energy to a signal component at Fs. Because there is generally other "rubbish" on the output waveform at an Fs component, or at an Fs/2 component, it is relatively easy to deal with such distortions and unwanted spurs. Thus, making removing the common mode leakage energy much easier, in accordance with one or more examples.

In one or more examples, as illustrated for example in FIG. 4, what is done is an injection of charge into nodes X and Y, respectively. This charge injection is driven by changes in S/SB, on top of the unavoidable charge caused by toggling of D/DB. The addition of those additional charge injections from the S/SB switching pollutes X, Y and Vbc with "data independent" charge injections, thus transforming the charge injections from their standard "data dependent" characteristic.

Table A below summarizes in chart form the performance of a split bleeder shadow switching DAC circuit.

TABLE A

| Parameter | Split BSS |
| --- | --- |
| IM3 | Better at low VOP and high frequency; Same at high VOP |
| CM Leak Spectrum | Better at low VOP and high frequency; Same at high VOP. Better improvement at high VOP relative to stacked cascode for same NSD |
| Mismatch Spur @Fs/2 - Fin | Ensures good spur to distortion components ratio, even at low VOP, −20 dBFS backoff |
| NSD | Similar at both high and low VOP |

Thus, in one or more examples, a DAC current steering circuit provides a robust implementation which retains the benefit of bleeder arm shadow switching, and also provides low mismatch spurs and low NSD. DAC current steering circuits according to one or more examples require no additional power compared to a conventional DAC that is provided with shadow switching transistors in order to generate shadow signals for drivers.

While the foregoing is directed to embodiments of the present invention, other and further embodiments of the invention may be devised without departing from the basic scope thereof, and the scope thereof is determined by the claims that follow.

What is claimed is:

1. A digital to analog converter (DAC) current steering circuit, comprising:
   first and second transistors, a drain of the first transistor coupled to a first output, a source of the first transistor coupled to a drain of the second transistor at a first node, and a gate of the second transistor coupled to a data input (D);
   third and fourth transistors, a drain of the third transistor coupled to a second output, a source of the third transistor coupled to a drain of the fourth transistor at a second node, and a gate of the fourth transistor coupled to a complement of the data input (DB); and
   a first bleeder transistor, whose drain is coupled to the first node, and a second bleeder transistor, whose drain is coupled to the second node, wherein the sources of the first and second bleeder transistors are coupled together at a third node, the third node coupled to ground; and
   first and second bleeder switching transistors, whose drains and sources are each coupled to the third node, a gate of the first bleeder switching transistor coupled to a switching input (S) and a gate of the second bleeder switching transistor coupled to a complement of the switching input (SB).

2. The circuit of claim 1, further comprising one or more transistors in a bleeder current stack, the third node coupled to ground through the bleeder current stack.

3. The circuit of claim 2, further comprising:
   one or more transistors in a first side bleeder current stack, the first node coupled to ground through the first side bleeder current stack; and
   one or more transistors in a second side bleeder current stack, the second node coupled to ground through the second side bleeder current stack.

4. The circuit of claim 3, wherein the current bleeder stack is configured to generate a current equal to 2*Ibleed/N, for a current Ibleed and an integer N.

5. The circuit of claim 4, wherein each of the first side bleeder current stack and the second side bleeder current stack is configured to generate a current equal to (N−1)*Ibleed/N.

6. The circuit of claim 1, wherein sources of the second and fourth transistors are coupled together and to ground at a fourth node.

7. The circuit of claim 6, further comprising one or more transistors in a main current stack, the fourth node coupled to ground through the main current stack.

8. The circuit of claim 1, wherein the S and SB switching signals are switched at a pre-defined rate, but not switched when the D and DB signals are toggled.

9. The circuit of claim 1, wherein, when switched, the S and SB signals are switched in a make before break manner.

10. A split bleeder current circuit for a DAC circuit, comprising:
    a first bleeder current arm coupled to a first node of the DAC circuit, the first node coupled to a first output of the DAC circuit, and to ground;
    a second bleeder current arm coupled to a second node of the DAC circuit, the second node coupled to a second output of the DAC circuit, and to ground;
    a central bleeder current arm coupled to each of the first and second nodes and to a common bleeder node, the common bleeder node coupled to ground; and a pair of shadow switching transistors whose drains and sources are each coupled to the common bleeder node, a gate of a first shadow switching transistor of the pair of shadow switching transistors coupled to a switching input (S) and a gate of a second shadow switching transistor of the pair of shadow switching transistors coupled to a complement of the switching input (SB).

11. The circuit of claim 10, wherein, when switched, the S and SB signals are switched in a make before break manner.

12. The circuit of claim 10, wherein the S and SB switching signals are switched at a pre-defined rate, but not switched when the D and DB signals are toggled.

13. The circuit of claim 10, wherein bleeder currents in each of the first and second bleeder current arms are the same.

14. The circuit of claim 10, wherein the central bleeder current arm is configured to have a current equal to 2*Ibleed/N, for a current Ibleed and an integer N.

15. The circuit of claim 14, wherein the current in each of the first and second bleeder current arms is configured to have a current equal to (N−1)*Ibleed/N.

16. The circuit of claim 15, wherein the value of N is tunable.

17. A method of operating a DAC current cell with split bleeder currents, comprising:

receiving a digital data signal ("D") at a first transistor of a coupled transistor pair of a DAC, and a complement of the data signal ("DB") at a second transistor of the coupled transistor pair;

generating bleeder currents at each of first and second side bleeder arms and a central bleeder arm, the first side bleeder arm coupled to the first transistor and to ground, the second side bleeder arm coupled to the second transistor and to ground, and the central bleeder arm coupled to each of the first and second transistors and to a central bleeder current node, the central bleeder current node coupled to ground; and applying first and second shadow switching inputs to gates of first and second shadow switching transistors, wherein drains of each of the first and second shadow switching transistors are coupled together and to sources of the first and second shadow transistors, and are further coupled to the central bleeder current node.

18. The method of claim 17, wherein the central bleeder arm is configured to have a current equal to 2*Ibleed/N, the current in each of the first and second bleeder arms is configured to have a current equal to (N−1)*Ibleed/N, for a current Ibleed and an integer N.

19. The method of claim 18, wherein N is from 2-5.

20. The method of claim 18, wherein the value of N is tunable, and further comprising:

changing the value of N from one application to the other.

* * * * *

UNITED STATES PATENT AND TRADEMARK OFFICE
CERTIFICATE OF CORRECTION

| | |
|---|---|
| PATENT NO. | : 11,265,001 B1 |
| APPLICATION NO. | : 17/115530 |
| DATED | : March 1, 2022 |
| INVENTOR(S) | : Lahiri |

It is certified that error appears in the above-identified patent and that said Letters Patent is hereby corrected as shown below:

In the Specification

Column 4, Line 62, Delete "VDD" and insert -- $V_{DD}$ --, therefor.

Column 10, Line 6, Delete "c," and insert -- $\varepsilon$, --, therefor.

Column 10, Line 8, Delete "E" and insert -- $\varepsilon$ --, therefor.

Column 10, Line 13, Delete "C," and insert -- $\varepsilon$, --, therefor.

Signed and Sealed this
Twenty-first Day of June, 2022

Katherine Kelly Vidal
*Director of the United States Patent and Trademark Office*